(12) United States Patent
Kirkendall et al.

(10) Patent No.: US 11,165,410 B2
(45) Date of Patent: Nov. 2, 2021

(54) BULK ACOUSTIC WAVE RESONATOR

(71) Applicant: Avago Technologies International Sales Pte. Limited, Singapore (SG)

(72) Inventors: Chris Kirkendall, Hollister, CA (US); Brice Ivira, San Jose, CA (US); Wingra Fang, San Jose, CA (US)

(73) Assignee: Avago Technologies International Sales Pte. Limited, Singapore (SG)

( * ) Notice: Subject to any disclaimer, the term of this patent is extended or adjusted under 35 U.S.C. 154(b) by 0 days.

(21) Appl. No.: 16/590,203

(22) Filed: Oct. 1, 2019

(65) Prior Publication Data
US 2021/0099156 A1 Apr. 1, 2021

(51) Int. Cl.
*H03H 9/17* (2006.01)
*H03H 9/13* (2006.01)
*H03H 9/02* (2006.01)

(52) U.S. Cl.
CPC ........ *H03H 9/175* (2013.01); *H03H 9/02102* (2013.01); *H03H 9/132* (2013.01)

(58) Field of Classification Search
CPC ....... H03H 9/46–605; H03H 9/17–177; H03H 9/13–133; H03H 9/02007–02157
See application file for complete search history.

(56) References Cited

U.S. PATENT DOCUMENTS

| | | | | |
|---|---|---|---|---|
| 7,629,865 B2 * | 12/2009 | Ruby | ................. | H03H 9/02118 333/188 |
| 7,986,075 B2 * | 7/2011 | Asai | ..................... | H03H 9/0514 310/324 |
| 8,922,302 B2 * | 12/2014 | Ruby | ..................... | H03H 9/172 333/187 |
| 10,097,156 B2 * | 10/2018 | Chang | ................ | H03H 9/02157 |
| 10,666,220 B2 * | 5/2020 | Kida | ........................ | H03H 9/568 |
| 10,666,224 B2 * | 5/2020 | Shin | ......................... | H03H 3/02 |
| 10,886,888 B2 * | 1/2021 | Ivira | ...................... | H03H 9/132 |
| 2020/0373901 A1 * | 11/2020 | Liu | ......................... | H03H 9/706 |

* cited by examiner

*Primary Examiner* — Dean O Takaoka
*Assistant Examiner* — Alan Wong
(74) *Attorney, Agent, or Firm* — Foley & Lardner LLP

(57) ABSTRACT

A bulk acoustic wave (BAW) resonator is disclosed. The BAW resonator includes: a first electrode, a second electrode, a piezoelectric layer disposed between the first electrode and the second electrode, a substrate positioned adjacent to the second electrode, and an active area having at least one biarc boundary.

22 Claims, 11 Drawing Sheets

BULK ACOUSTIC WAVE RESONATOR

FIELD OF THE DISCLOSURE

The present disclosure is generally directed toward acoustic resonator devices.

BACKGROUND

Electrical resonators are widely incorporated in modern electronic devices. For example, in wireless communications devices, radio frequency (RF) and microwave frequency resonators are used in filters, such as filters having electrically connected series and shunt resonators forming ladder and lattice structures. The filters may be included in a duplexer (diplexer, triplexer, quadplexer, quintplexer, notch filters, etc.) for example, connected between an antenna and a transceiver for filtering received and transmitted signals.

Various types of filters use mechanical resonators, such as bulk acoustic wave (BAW) resonators, including film bulk acoustic resonators (FBARs) and solidly mounted resonators (SMRs), or surface acoustic wave (SAW) resonators. The resonators convert electrical signals to mechanical signals or vibrations, and/or mechanical signals or vibrations to electrical signals. A BAW resonator, for example, is an acoustic device comprising a stack that generally includes a layer of piezoelectric material between two electrodes. Acoustic waves achieve resonance across the acoustic stack, with the resonant frequency of the waves being determined by the materials in the acoustic stack and the thickness of each layer (e.g., piezoelectric layer and electrode layers). One type of BAW resonator includes a piezoelectric film as the piezoelectric material, which may be referred to as an FBAR as noted above. FBARs resonate at GHz frequencies, and are thus relatively compact, having thicknesses on the order of microns and length and width dimensions of hundreds of microns.

Among other uses, acoustic resonators may be used as notch filters or band-pass filters with associated passbands providing ranges of frequencies permitted to pass through the filters. With increasing power requirements placed on devices (e.g., mobile phones), ever increasing power demands are placed on filters, and particularly the resonators of the filters. These increasing power demands can have adverse impacts on the performance and reliability of the resonators. For example, as radio frequency (RF) signals with greater electrical power are applied to known RF resonators, excessive self-heating can occur near the geometric center of the active acoustic stack, which is the farthest from the points where the active acoustic stack contacts the substrate (so-called anchor points or thermal ground where power is dissipated). As can be appreciated, the size and shape of the hot spot depends on the frequency and power applied and absorbed, as well as the thermal resistance.

The temperature gradient in the hot spot creates an active area divided into multiple resonators resonating at different frequencies, and with different acoustic properties. This temperature gradient also impacts the physical properties of the material (e.g., material stiffness, dielectric permittivity, piezoelectric coefficients), and creates acoustic discontinuities in the active acoustic stack. These acoustic discontinuities in the region of the hot spot results in further energy confinement, which is manifest in further heating at the hot spot.

BRIEF DESCRIPTION OF THE DRAWINGS

The example embodiments are best understood from the following detailed description when read with the accompanying drawing figures. It is emphasized that the various features are not necessarily drawn to scale. In fact, the dimensions may be arbitrarily increased or decreased for clarity of discussion. Wherever applicable and practical, like reference numerals refer to like elements.

DETAILED DESCRIPTION

Figure 1:
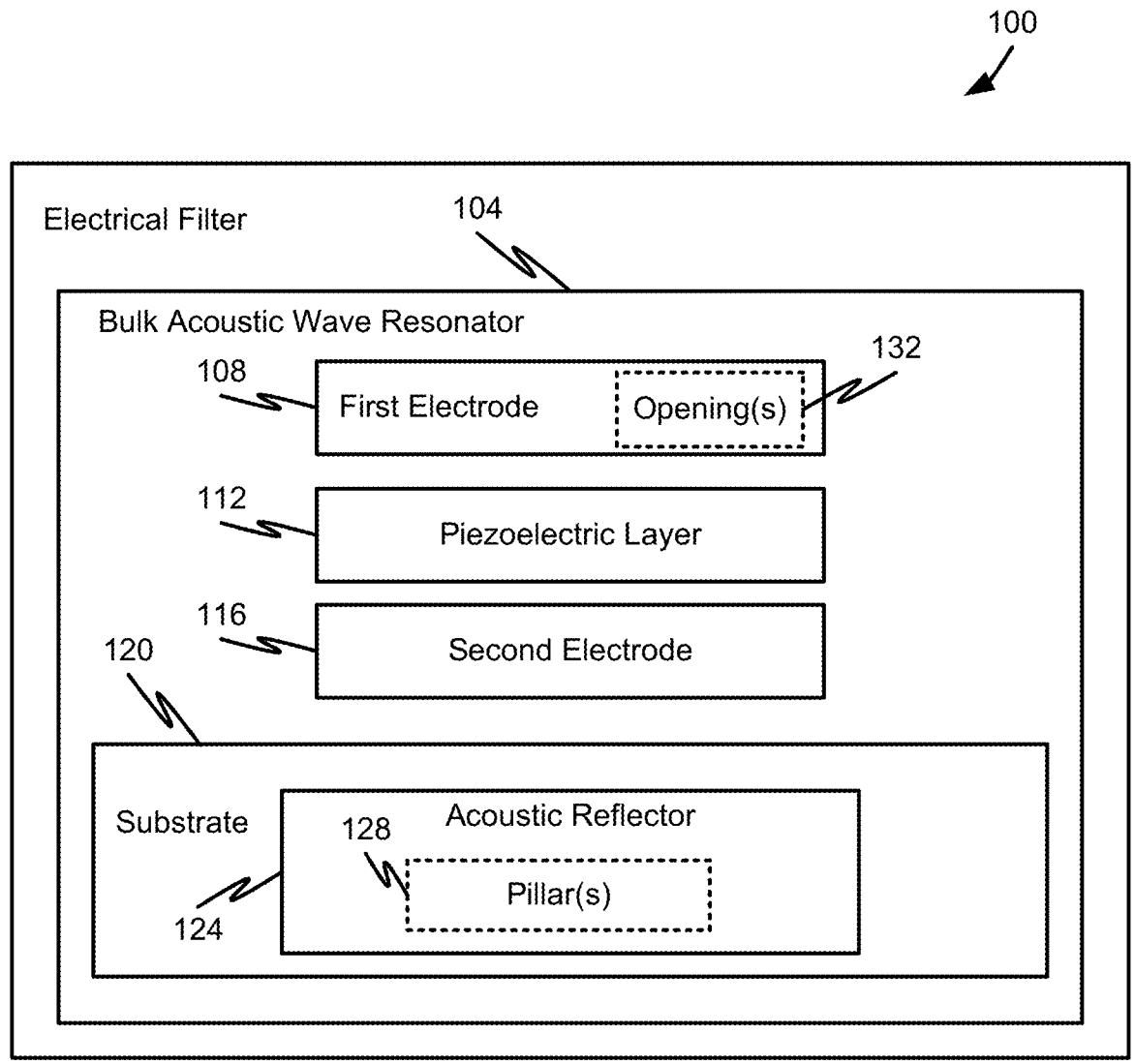
FIG. 1 is a block diagram of an electrical filter having a BAW resonator in accordance with at least some embodiments of the present disclosure.

In the following detailed description, for purposes of explanation and not limitation, representative embodiments disclosing specific details are set forth in order to provide a thorough understanding of the present teachings. However, it will be apparent to one having ordinary skill in the art having had the benefit of the present disclosure that other embodiments according to the present teachings that depart from the specific details disclosed herein remain within the scope of the appended claims. Moreover, descriptions of well-known apparatuses and methods may be omitted so as to not obscure the description of the representative embodiments. Such methods and apparatuses are clearly within the scope of the present teachings.

It is to be understood that the terminology used herein is for purposes of describing particular embodiments only and is not intended to be limiting. Any defined terms are in addition to the technical and scientific meanings of the defined terms as commonly understood and accepted in the technical field of the present teachings.

As used in the specification and appended claims, the terms 'a', 'an' and 'the' include both singular and plural referents, unless the context clearly dictates otherwise. Thus, for example, 'a device' includes one device and plural devices.

As used in the specification and appended claims, and in addition to their ordinary meanings, the terms 'substantial' or 'substantially' mean to with acceptable limits or degree. For example, 'substantially cancelled' means that one skilled in the art would consider the cancellation to be acceptable.

As used in the specification and the appended claims and in addition to its ordinary meaning, the term 'approximately' means to within an acceptable limit or amount to one having ordinary skill in the art. For example, 'approximately the same' means that one of ordinary skill in the art would consider the items being compared to be the same.

Relative terms, such as "above," "below," "top," "bottom," "upper" and "lower" may be used to describe the various elements' relationships to one another, as illustrated in the accompanying drawings. These relative terms are intended to encompass different orientations of the device and/or elements in addition to the orientation depicted in the drawings. For example, if the device were inverted with respect to the view in the drawings, an element described as "above" another element, for example, would now be "below" that element. Similarly, if the device were rotated by 90 degrees with respect to the view in the drawings, an element described "above" or "below" another element would now be "adjacent" to the other element; where "adjacent" means either abutting the other element, or having one or more layers, materials, structures, etc., between the elements.

The above-identified shortcomings and issues associated with resonator devices are addressed by embodiments of the present disclosure. Specifically, standard attempts to address power handling by using high aspect ratio resonator devices. In addition, some resonator devices address self-heating by adding one or more circular or oval openings with a pillar inside. Aspects of the present disclosure provide concepts for addressing self-heating and undesirable spurious modes that are exacerbated in higher aspect ratio resonators. One aspect of the present disclosure is to provide an opening and pillar in a resonator device whose shape is defined by a general class of polynomial curves (e.g., spline curves or synthetic curves). These spline curves or synthetic curves can be of many specific types (e.g., Bezier curves based on Bernstein polynomials, cubic spline curves, B-spline curves, Beta-spline curves, etc.). Using such curves to define the opening and/or pillar shape affords the introduction of concavity into the resonator device design and better accommodates the outer perimeter shape for enhanced thermal and acoustic performance.

Another aspect of the present disclosure is to use of the same type of polynomial spline curves or synthetic curves on the boundary of the resonator device or more specifically a boundary of an active area in the resonator device. The boundary having one or more spline curves or synthetic curves may correspond to an outer boundary or an inner boundary of the active area. It should be appreciated that the use of a curved boundary for the active area may be utilized with or without the opening and pillar described above. The use of a curved boundary to define some or all of the active area enables further apodization and reduces the strength of spurious modes that are exacerbated in higher aspect ratio resonator devices and in resonator devices having an opening and pillar (e.g., due to decreased distance between edges of the perimeter).

By introducing concavity (e.g., through the use of a spline or synthetic curve) and by allowing one to control the area to perimeter ratio more freely, as well as the radius of curvature along the opening/pillar perimeter, aspects of the present disclosure are distinct from circular and oval-type openings, which are restricted to be convex. The new freedom offered by openings/pillars defined using spline curves allows enhanced thermal, acoustic, and mechanical performance.

The use of spline curves to define the boundary of an active area also allows for enhanced apodization, which is different from standard apodization that still leaves many straight edges. Especially in high aspect ratio resonator devices, even apodized resonators can become essentially rectangular and lose some of the effect of apodization. The use of spline curves, for instance, preserves the apodization in these more extreme situations, which become necessary to handle self-heating.

It is with respect to these and other aspects of the present disclosure that illustrative resonator devices will be described. While particular configurations and designs of resonator devices will be described in accordance with at least some embodiments, it should be appreciated that the claims are not limited to those examples described herein. Rather, as will be appreciated by those of skill in the art, any combination of features depicted and/or described herein may be used in a resonator device without departing from the scope of the present disclosure.

Referring now to FIG. 1, an illustrative electrical filter 100 including a resonator device 104 will be described in accordance with at least some embodiments of the present disclosure. The resonator device 104 may correspond to one example of a resonator device, such as a BAW resonator 104. As will be discussed in further detail herein, the BAW resonator 104 may include a number of components or elements that enable the electrical filter 100 to provide signal filtering functions. For instance, the BAW resonator 104 may be configured to resonate at a particular frequency or range of frequencies to provide the electrical filter 100 with the ability to filter electrical signals at or near the resonant frequency(ies) of the BAW resonator 104.

The illustrative BAW resonator 104 is shown to include a first electrode 108, a second electrode 112, and a piezoelectric layer 112 provided there between. The BAW resonator 104 is also shown to include a substrate 120 on which the first electrode 108, piezoelectric layer 112, and second electrode 116 are provided.

In some embodiments, the first electrode 108 may include a first surface and an opposing second surface. The piezoelectric layer 112 may also include a first surface and an opposing second surface. The first surface of the piezoelectric layer 112 may correspond to the surface of the piezoelectric layer 112 that faces toward the second surface of the first electrode 108. The second electrode 116 may also include a first surface and an opposing second surface. The first surface of the second electrode 116 may correspond to the surface of the second electrode 116 that faces toward the second surface of the piezoelectric layer 112. This particular configuration of the first electrode 108, piezoelectric layer 112, and second electrode 116 may result in the piezoelectric layer 112 being sandwiched between the first electrode 108 and second electrode 116.

The first electrode 108 and second electrode 116 may be formed of the material or of different materials. Specifically, the first electrode 108 and second electrode 116 may be formed of one or two (bi-electrode) electrically conductive materials (e.g., molybdenum (Mo), W, Pt, Ru, Al, Ta, Cu, or Ru). The first electrode 108 and second electrode 116 may be formed of a common electrically conductive material or different electrically conductive materials.

The piezoelectric layer 112 may include a highly textured piezoelectric material (e.g., AlN), and thus have a well-defined C-axis. In an electrical filter 100 comprising a plurality of BAW resonators 104, the polarization of each BAW resonator 104 impacts the type of the connection (e.g., series connection, anti-series connection) that is made between the BAW resonators 104. As will be appreciated by one of ordinary skill in the art, the growth of piezoelectric material along a C-axis of the material dictates the polarization of the BAW resonator 104, and thus the type of connection to be implemented.

The substrate 120 is shown to be adjacent to the second surface of the second electrode 116. Thus, in some embodiments, the stack of the first electrode 108, piezoelectric layer 112, and second electrode 116 may be supported by the substrate 120. The substrate 120, in some embodiments, may include silicon (e.g., polycrystalline or monocrystalline), but other materials, such as gallium arsenide (GaAs) and indium phosphide (InP), are contemplated. In some embodiments, the substrate 120 may comprise a plurality of layers. For example, a seed layer and a dielectric layer may be included in the substrate 120, but such layers are optional. As will be discussed above, another internal layer, such as a dielectric, can be added to the active stack of the first electrode 108, piezoelectric layer 112, and second electrode 116. The addition of an internal layer may be used to provide temperature compensation capabilities or the like.

The substrate 120 is shown to include an acoustic reflector 124. As will be discussed in further detail herein, the acoustic reflector 124 may include or help define an active area of the BAW resonator 104. As will be appreciated and discussed in further detail herein, the shape and relative placement of the first electrode 108, piezoelectric layer 112, second electrode 116, and/or acoustic reflector 124 may contribute to the shape of the active area. In some embodiments, the active area may include one or more boundaries that defines a volume within the BAW resonator 104 that operates to provide the filtering capabilities described herein. The acoustic motion of particles is launched and propagated in this volume. This acoustic motion contributes to the self-heating of the BAW resonator 104 described herein. By contrast, an inactive area of the BAW resonator 104 comprises a region of overlap between second electrode 116, or first electrode 108, or both, and the piezoelectric layer 112 that is not disposed over the acoustic reflector 124. The active area may be at least partially defined by a curved boundary or multiple curved boundaries (e.g., outer boundaries and additional inner boundaries in the case of an opening/pillar). In some embodiments, the curved boundary defining the active area may be centered outside of the active area and/or outside of the acoustic reflector 124. In some embodiments, the curved boundary may include a curved segment having a first curvature and a second curvature that share a common tangent at a connecting point between the first curvature and the second curvature and a radius of the first curvature is centered at a different point than a radius of the second curvature. In some embodiments, the first curvature and the second curvature of the curved boundary form a spline-shaped curve having at least three control points. In some embodiments, the curved boundary may correspond to or include at least one biarc boundary. In some embodiments, the active area is at least partially defined by a curved boundary having a concavity that changes sign at least once. Other alternatives and details related to the active area, the acoustic reflector 124 and the boundaries thereof will be described in further detail herein.

In some embodiment, the acoustic reflector 124 may be filled with a material such as an acoustic reflective material. In some embodiments, the acoustic reflector 124 may not necessarily be filled with a material. As a more specific example, when the acoustic reflector 124 is filled with a material, that acoustic reflector 124 may correspond to an acoustic reflector that includes alternating layers of high acoustic impedance material and low acoustic impedance materials formed in or on the substrate 120. Illustratively, this type of acoustic reflector is often referred to as an acoustic Bragg reflector. Alternatively, the acoustic reflector 124 may be filled with air or another material that enables the acoustic reflector 124 to function as an acoustic reflector reflecting acoustic waves. Thus, while the term acoustic reflector or cavity is used to describe the structure 124 and related structures, it should be appreciated that references to a cavity are intended to include acoustic reflectors or similar elements. In other words, a resonant cavity may be provided in addition to or in lieu of an acoustic reflector 124 without departing from the scope of the present disclosure.

In some embodiments, the acoustic reflector 124 may include one or more pillars 128 and the first electrode 108 may include one or more openings 132 that correspond to the one or more pillars 128. The one or more pillars 128 and/or one or more opening(s) 132 may correspond to optional features of the BAW resonator 104. The opening 132 is not made in layers beneath the first electrode 108 (e.g., the piezoelectric layer 112 or the second electrode 116). In some embodiments, no electrical connections extend from one side of an opening 132 to another.

The shape of the pillar(s) 128 may be used in defining a shape of the opening(s) 132. Likewise, the number of pillar(s) 128 may be used in defining the number of opening(s) 132. The pillar(s) 128 and/or opening(s) 132 may also contribute to or define a shape of an inner boundary of an active area. As an example, each pillar 128 may have a corresponding opening 132 and the shape used for a particular pillar 128 may also be used for the corresponding opening 132. In some embodiments, the pillar 128 and corresponding opening 132 may be provided in a round, circular, or elliptical shape. In some embodiments, the pillar 128 and corresponding opening 132 may be substantially spline curve-shaped. In some embodiments, the pillar 128 and corresponding opening 132 may correspond to a single arc shape (e.g. a line segment having a single radius of curvature). In some embodiments, the pillar 128 and corresponding opening 132 may shaped with a plurality of straight line segments that approximate or resemble a curved line having one or more radii of curvature. In embodiments including a pillar 128 and/or opening 132, the line may have a thickness corresponding to the pillar 128 width and/or opening 132 width. Combinations of different shapes may be used for the pillars 128 and openings 132 of any particular BAW resonator 104.

In some embodiments, the material used for the pillar(s) 128 may correspond to a similar or same material as is used for the acoustic reflector 124 and/or substrate 120. In some embodiments, a different material may be used for the pillar(s) 128. It may also be possible for the acoustic reflector 124 to have multiple pillars 128 and each pillar may or may not be constructed of the same material. The pillar(s) 128 may optionally include a material that has substantially the same coefficient of thermal expansion (CTE) as the substrate 120. In other embodiments where the pillar 128 has a dissimilar material, the CTE of the pillar material and the substrate material differs in a range such that delamination can be prevented. In other words, other than heat dissipation, the pillar material may be selected considering other factors which may affect the reliability of the BAW resonator 104 such as CTE mismatch. In accordance with some embodiments, the pillar 128 may the same material as the substrate 120, which is illustratively silicon or another useful material used in the fabrication of BAW resonators 104. In such an embodiment, the pillar 128 may be formed during the fabrication of the acoustic reflector 124 through known masking, and dry or wet etching methods that would be readily apparent to one of ordinary skill in the art.

Alternatively, and in accordance with some embodiments, rather than silicon, the pillar(s) 128 may be constructed from a high thermal conductivity (high-k) material. High thermal conductivity materials contemplated include but are not limited to diamond, boron arsenide, boron binary (carbide, nitride), silicon carbide (SiC) (thermal conductivity of 300 W/mk). Notably, silicon has a thermal conductivity of approximately 150 W/mK. The noted high-k materials have a thermal conductivity material in the range of approximately 900 W/mK to approximately 2200 W/mK. Among other benefits, a pillar 128 made from a high-k material provides a reduced thermal resistance compared to a pillar 128 made of silicon and having the same diameter of the pillar 128 (or cross-sectional area if the pillar is not cylindrical).

Figure 2A:
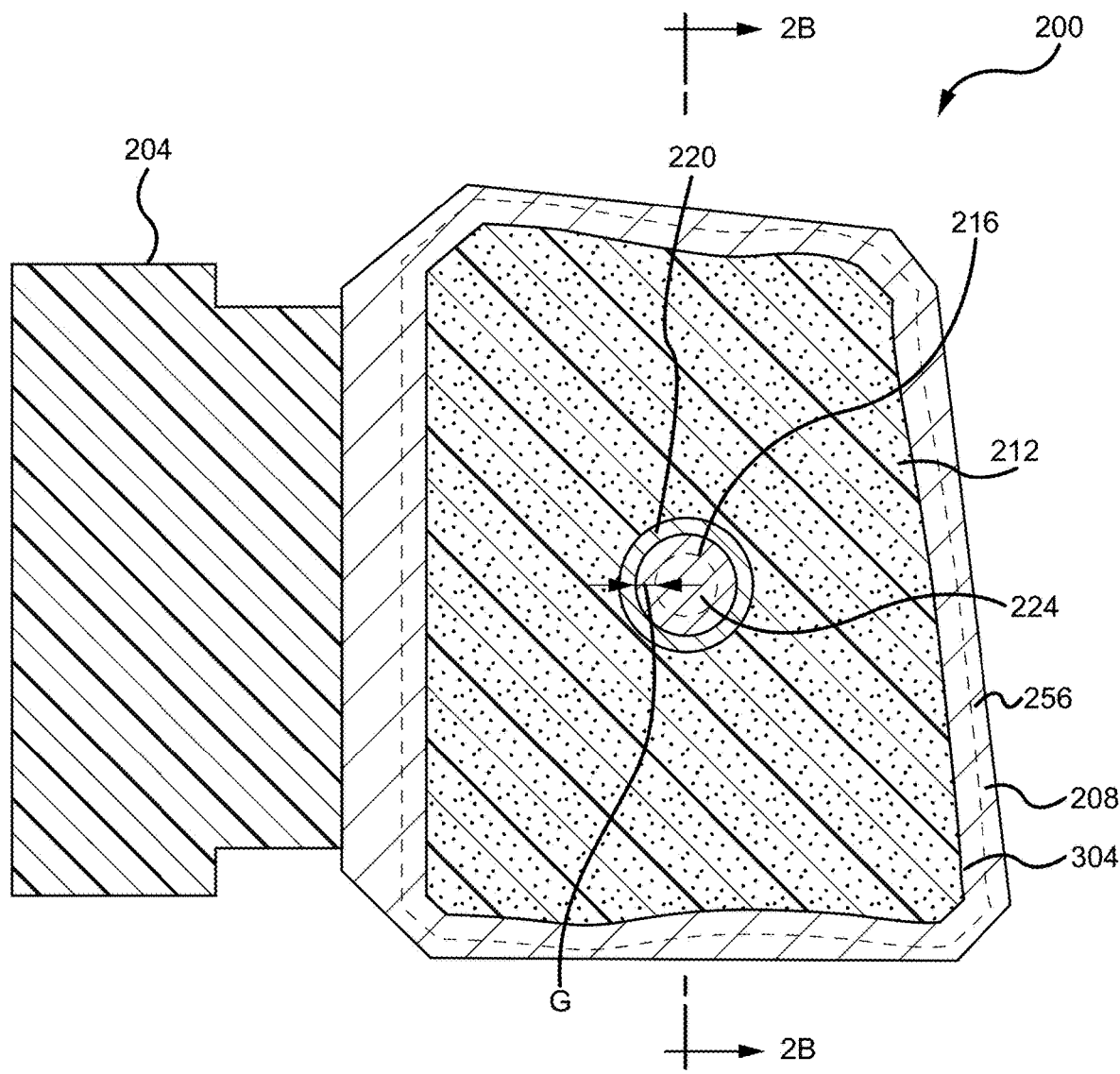
FIG. 2A is a top view of an illustrative BAW resonator in accordance with at least some embodiments of the present disclosure.
Figure 2B:
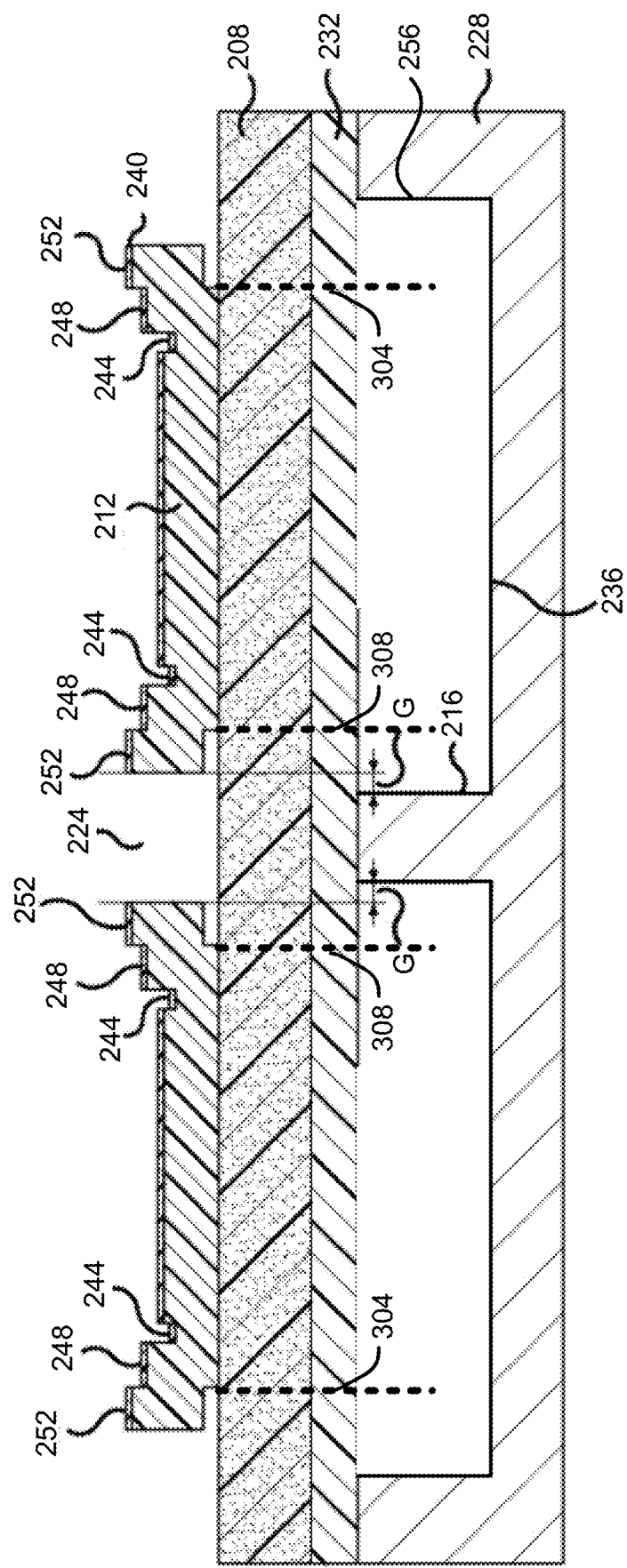
FIG. 2B is a cross-sectional view of the BAW resonator depicted in FIG. 2A taken along line 2B-2B.

With reference now to FIGS. 2A and 2B, a more specific, but non-limiting, example of a resonator device 200 will be described in accordance with at least some embodiments of the present disclosure. The resonator device 200 may correspond or be similar to the BAW resonator 104 of FIG. 1. In FIG. 2A, the resonator device 200 is shown to include an interconnect 204, a piezoelectric layer 208, a first electrode 212, a pillar 216, a frame element 220, and an opening 224. FIG. 2B further illustrates the resonator device 200 to include a substrate 228, a second electrode 232, an acoustic reflector 236, and an optional passivation layer 240.

The first electrode 212 may correspond to an example of the first electrode 108 or may be similar thereto. The piezoelectric layer 208 may be similar or identical to the piezoelectric layer 112. The second electrode 232 may be similar or identical to the second electrode 116. As discussed in connection with FIG. 1, the piezoelectric layer 208 may be situated between the first electrode 212 and the second electrode 232. The stack of the first electrode 212, piezoelectric layer 208, and second electrode 232 may be provided on top of the substrate 228. The substrate 228 may be similar or identical to the substrate 120, the acoustic reflector 236 may be similar or identical to the acoustic reflector 124, and the pillar 216 may correspond to an example of the pillar 128.

FIG. 2B also illustrates that the first electrode 212 may be provided with an opening 224 that is positioned over the pillar 216. In some embodiments, the shape of the opening 224 of the first electrode 212 may match the shape of the pillar 216, but the size of the opening 224 may be slightly larger than the size of the pillar 216 when viewed from the top. This difference in size may be represented as a gap (G) that expresses the difference in size between the pillar 216 and its corresponding opening 224.

The interconnect 204 may provide a signal input or signal output to the first electrode 212. A bridge may be optionally provided between the first electrode 212 and the interconnect 204; and cantilevered portions may be optionally provided over one or more of the sides of the first electrode 212, excepting the side of the interconnect 204.

As depicted more clearly below, the region of contacting overlap of the second electrode 232, first electrode 212, and the piezoelectric layer 208 may be referred to as an active area of the resonator device 200. The active area may reside within the acoustic reflector 236. In some embodiments, the area of the acoustic reflector 236 is larger than the active area such that the active area resides completely within the acoustic reflector 236. Sidewalls 256 of the acoustic reflector 236 may define the area of the acoustic reflector 236 whereas the size and/or shape of the first electrode 212, second electrode 232, and/or piezoelectric layer 200 may define the size and/or shape of the active area. More specifically, the active area of the resonator device 200 is shown to have an outer boundary 304 and an inner boundary 308. As the active area is a region of contacting overlap of the second electrode 232, first electrode 212, and the piezoelectric layer 208, the boundary of the active area 304 and/or 308 may be adjusted by using all the three layers 212, 208 and 232, or by adjusting at least one of the three layers 212, 208 and 232. For example, in the embodiment shown in FIG. 2A and FIG. 2B, the first electrode 212 is bent upwardly to create an air gap so as to define the inner boundary 308 and the outer boundary 304. In a similar way, other material that is not acoustically active such as air or a dielectric material may be inserted to break the contacting overlap arrangement of the three layers 212, 208, and 232 so as to define the boundary 304 and/or 308. For example, when three layers 212, 208, 232 that form the acoustic area vibrates in a resonant frequency in accordance with an electric field generated therein, the other material inserted may remain non-acoustically active or may vibrate out of synchronization as compared to the resonant frequency. In other embodiments, the boundary 304 and/or 308 may be adjusted by having a smaller piezoelectric layer 208 or a smaller second electrode 232. For example, in an embodiment where all three layers 212, 208, and 232 are different, the boundary of the active area may be the boundary of one of the three layers 212, 208, and 232 that is smallest in geometry. In yet another embodiment, the boundary 304 and/or 308 may be defined by all the three layers 212, 208 and 232 being conformal to each other. In some embodiments, one or all of the three layers 212, 208, and 232 may comprise an internal layer, for example, a temperature compensation layer within the piezoelectric layer 208. The internal layer may be adapted to be substantially acoustically active and further adapted to vibrate in the resonant frequency in accordance with an electric field generated therein within the three layers 212, 208, and 232.

The active area may correspond to an area or volume in the resonator device 200 defined by the region of the piezoelectric layer 208 that contacts (directly or indirectly in the z-dimension) both the first electrode 212 and the second electrode 232. In some embodiments, the active area may be referred to as an acoustically active area. In some embodiments, the active area may be referred to as an electrically active area. In some embodiments, the acoustically active area may coincide with the electrically active area whereas in other embodiments the acoustically active area does not coincide with the electrically active area. The outer boundary 304 and inner boundary 308 may be considered boundaries or borders of the active area and the position of the boundaries 304, 308 may be determined based on a shape of the first electrode 212, the second electrode 232, and/or the piezoelectric layer 208. Although the shape of the acoustic reflector 236 (as determined by the shape of the sidewalls 256) is shown as being conformal with the shape of the active area, it should be appreciated that this particular configuration is optional. The acoustic motion of particles is launched and propagated in this area residing between the outer boundary 304 and inner boundary 308. This acoustic motion contributes to the self-heating of the resonator device 200 described below. By contrast, an inactive area of the resonator device 200 comprises a region of overlap between second electrode 232, or first electrode 212, or both, and the piezoelectric layer 208 that is not disposed in a contacting relationship over the acoustic reflector 236. An opening 224 is provided in the first electrode 212. As described more fully below, the opening 224 is not made in layers beneath the first electrode 212 (e.g., the piezoelectric layer 208 or the second electrode 232). Notably, no electrical connections extend from one side of the opening 224 to the other.

A pillar 216 is disposed beneath the opening 224. As described more fully below, in addition to providing mechanical stability to the membrane of the resonator device 200, the pillar 216 provides a thermal sink, which beneficially dissipates heat from the region of the opening 224. In some embodiments, the pillar 216 comprises an elongated structure and being disposed within the resonator device 200, but being distanced away from the outer boundary 304 of the active area. The pillar 216 may be referred to as an elongated thermal structure. The pillar 216 extends in a longitudinal direction thermally connecting the substrate 228 and the second electrode 232. A cross-sectional view of the pillar 216 taken at a direction perpendicular to the longitudinal direction of the elongated structure may comprise a circular shape (and thus circular cross-section) as shown in FIG. 2A, but in other embodiments, the cross sectional view of the pillar 216 may be elliptical, square, heptagon, hexagon or any other irregular shape. In some embodiments, the shape of the pillar 216 may correspond to a spline curve-shaped pillar that substantially matches a spline curve-shaped opening 224. In some embodiments, the shape of the pillar 216 and/or the shape of the opening 224 contribute to or define the shape of the inner boundary 308 of the active area.

As shown in FIGS. 2A and 2B, the cross-sectional view of the pillar 216 may be co-axially aligned with the opening 224. As described more fully herein, the gap (G) exists as shown. In another embodiment, the pillar 216 may be substantially aligned with the opening 224 such that the gap (G) may be close to zero. Generally, the pillar 216 has a cross-sectional shape that is substantially the same as the shape of the opening 224. In accordance with some embodiments, the pillar 216 may have a cross-sectional area that is approximately less than 30% of the active area of the resonator device 200.

As discussed above, the pillar 216 may comprise a pillar material that is substantially the same as a material of the substrate 228. Alternatively, the pillar 216 may comprise a material that is dissimilar to the substrate 228. For example, the pillar 216 may comprise a pillar material that has higher heat conductivity as compared to the material of the substrate 228. One example of such pillar material may be copper and the substrate 228 may be silicon. Alternatively, the pillar 216 may comprise more than one pillar material. For example, the pillar 216 may comprise a pillar stack of a first material stacking on a second material. For example the pillar stack may comprise a metallic material stacked over a silicon material over vice versa. In some embodiments, the pillar 216 optionally comprises a material that has substantially the same coefficient of thermal expansion (CTE) as the substrate. In other embodiments where the pillar 216 has a dissimilar material, the CTE of the pillar material and the substrate material differs in a range such that delamination can be prevented. In other words, other than heat dissipation, the pillar material may be selected considering other factors which may affect the reliability of the resonator device 200 such as CTE mismatch.

In some embodiments, the opening 224 has an inner perimeter, and the resonator device 200 has an outer perimeter. The inner perimeter bounds the opening 224, which is not a portion of the active area of the resonator device 200, and normally has frame elements 220 along the inner perimeter. The outer perimeter defines the interface between the active area of resonator device 200, and the non-active/ dead portion of the resonator device 200. The opening 224 may be located away (e.g., farther away) from the outer perimeter. By providing a separation between the inner perimeter and the outer perimeter, the magnitude of undesirable spurious modes (rattles) decreases. The thermal resistance of the resonator device 200 will decrease as the total perimeter (inner and outer) of the resonator device 200 increases. The shape of the resonator device 200 as well as the connection configuration may dictate the best placement of the pillar 216 to minimize current crowding, while the resistance at parallel resonance (Rp) is beneficially maintained at as great as possible.

Of note, in accordance with the present teachings, there are no electrical connections that extend from one side of the opening 224 to the other. This is also applicable in embodiments described below, which include a plurality of openings 224 in the resonator device 200.

As described more fully below, frame elements 220 are optionally provided along the perimeter of the opening 224, and therefore form a portion of the perimeter of the active area of the resonator device 200. As noted below, a frame element 220 and all subsequent embodiments, may include at least one or all of a recessed frame element 244, a raised frame element 248, a cantilevered portion (sometimes referred to as a "wing") 252, or other structures located at the perimeter of the opening 224 that is distinguishable from an inner portion of the active area of the resonator device 200. The use of frame elements 220 may be provided to reduce acoustic energy loss, and therefore improve the quality-factor (Q) of the resonator device 200. However, reflections of acoustic waves at the frame elements 220 provided along the perimeter of the opening 224 also reduce the likelihood of energy loss through the pillar 216.

In some embodiments, the opening 224 is located in a region of the resonator device 200 that is otherwise susceptible to unacceptable levels of overheating caused by self-heating as observed in a comparable resonator device without the opening 224 or the pillar 216. This region is often comparatively far from a thermal ground, or anchor point, which is a portion of the inactive area that contacts the substrate 228. Notably, the opening 224 and/or pillar 216 may be substantially spline curve-shaped to help reduce self-heating. More specifically, by using a concave and/or convex shape defined by a spline function, a single, connected pillar 216 can accommodate the shape of the resonator device's 200 outer perimeter. This provides two distinct advantage: (1) a reduced risk of pillar delamination compared to using multiple smaller circular pillars and (2) a reduced maximum resonator bow under power due to thermal expansion. In order to conform to active area shape and reduce maximum temperature, circle and oval openings 224 require may require a small radii of curvature which leads to increased stress in the frames elements 224 under power. However, by using openings 224 defined by spline curves the minimum radius of curvature can be controlled while at the same time reducing self-heating.

In addition to addressing the self-heating issues associated with resonator devices that operate at high aspect ratios, the spline-shaped opening 224 and/or pillar 216 may also provide acoustic advantages for the resonator device 200. More specifically, use of a spline-shaped opening 224 and/or pillar 216 may smear out or otherwise disrupt the strong resonances that could otherwise occur with a pillar 216 and/or cavity 224 of a different shape.

In order to maintain the impedance of the resonator device 200 with the region of the opening 224 not contributing to the active area of the resonator device 200 as compared to a comparable BAW resonator not having an opening 224 and/or pillar 216, the area of the resonator device 200 can be increased outside of the region of the opening 224 by an amount substantially equal to the area of the opening 224. As will be appreciated, this additional area will result in an increase in the perimeter of the resonator device 200, which is in contact with the substrate 228. Because the distance from any point on the active area of the resonator device 200 to the anchor point is necessarily less by the elimination of the portion of the first electrode 212 to form the opening 224, the overall thermal resistance of the resonator device 200 is lower as compared to a comparable resonator device.

In some embodiments, the acoustic reflector 236 may be filled with air or another material that enables the acoustic reflector 236 to function as an acoustic reflector reflecting an acoustic wave. The piezoelectric layer 208 may include a second surface in contact with the second electrode 232 and a first surface in contact with the first electrode 212. An optional passivation layer 240 is provided over the first electrode 212.

As mentioned above, the opening 224 is not made in layers beneath the first electrode 212 (e.g., the piezoelectric layer 208 or the second electrode 232). The opening 224 is provided during fabrication of the first electrode 212 and passivation layer 240 using known masking methods.

In some embodiments, the pillar 216 is disposed in the acoustic reflector 236 and is aligned within the opening 224. The pillar 216 may contact a portion of the second electrode 232 disposed beneath the opening 224. The region of contacting overlap of the first and second electrodes 212, 232, the piezoelectric layer 208 and the acoustic reflector 236 is referred to as the active area of the resonator device 200. The acoustic motion of particles is launched and propagated in this area. This acoustic motion contributes to the self-heating of the resonator device 200 described above. The portion of the inactive area that contacts the substrate 228 and the pillar 216 may be referred to collectively as an anchor point of the resonator device 200 (in this case FBAR).

As noted above, the pillar 216 functions as an anchor point, or thermal ground, in same way as the anchor point of the substrate 228 described above. To this end, the pillar 216 reduces the overall thermal resistance of the resonator device 200 by providing a path to thermal ground, and beneficially contributes to thermal dissipation in the area of the opening 224, which is otherwise susceptible to overheating as observed in a comparable BAW resonator that is without the pillar 216 and/or the opening 224.

Even when the active area has one or more boundaries (e.g., outer boundary 304 and/or inner boundary 308) thereof substantially spline curve-shaped, it should be appreciated that the curvature of the one or more boundaries of the acoustic reflector 236 (e.g., sidewalls 256) may be substantially straight when viewed in cross-section (e.g., as shown in FIG. 2B). In some embodiments, the shape of the sidewalls 256 of the acoustic reflector 236 may approximate or contribute to a shape of the outer boundary 304 of the active area. In some embodiments, the shape of the sidewalls 256 may not necessarily be spline curve-shaped even when the outer boundary 304 of the active area has one or more segments that are spline curve-shaped. In some embodiments, the shape of the outer boundary 304 may be defined, at least in part, by a shape of the first electrode 212, a shape of the piezoelectric layer 208, and/or a shape of the second electrode 232. As a more specific example, the sidewalls 256 of the acoustic reflector 236 may not necessarily be spline curve-shaped, but one or more of the first electrode 212, piezoelectric layer 208, and second electrode 232 may be substantially spline curve-shaped, thereby creating an outer boundary 304 that is substantially spline curve-shaped. Alternatively or additionally, one or more of the inner boundaries 308 of the active area may be spline curve shaped, depending upon the presence and shape of the pillar 216 and/or opening 224. It should be appreciated that certain examples of a resonator device 200 may provide the first electrode 212 and cavity 236 in the silicon are curvy (e.g., have one or more sidewalls that are substantially spline curve-shaped), but the second electrode 232 (e.g., a bottom moly) does not have any substantially spline curve-shaped elements. Alternatively, there may be instances where the second electrode 232 does exhibit one or more spline curve-shaped sidewalls.

It should also be noted that the outer boundary 304 of the active area that is adjacent or facing toward the interconnect 204 may not exhibit a spline curve-shape. In other words, one or more outer boundaries 304 of the active area may be spline curve-shaped, with the exception of the segment of the boundary 304 that is nearest to or overlapping with the interconnect 204.

Figure 3A:
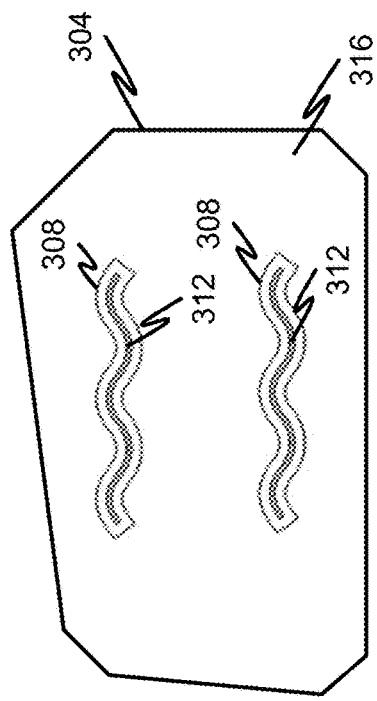
FIG. 3A is a diagram depicting an illustrative configuration of an active area of a BAW resonator in accordance with at least some embodiments of the present disclosure.

FIGS. 3A thru 3D depict various configurations of a resonator device 200 and an active area 316 of a resonator device 200 in accordance with at least some embodiments of the present disclosure. Specifically, as shown in FIG. 3A, an active area 316 is shown to include an inner boundary 308 and an outer boundary 304. The inner boundary 308 may be defined by a pillar 312 positioned within an opening 132, 224. The inner boundary 308 is shown to reside within an active area 316, which also exhibits an outer boundary 304. The outer boundary 304 may correspond to an outer perimeter of an active area. In some embodiments, the outer boundary 304 may correspond to a region of contacting overlap between the first electrode, second electrode, and piezoelectric layer. As such, a shape of the active area 316 may be controlled or defined by a shape of the first electrode, second electrode, and/or piezoelectric layer. The shape of the acoustic reflector 236 may also be similar to the shape of the active area 316. As shown in FIGS. 3A thru 3D, the outer boundary 304 may include a number of straight edges, which are positioned so as to not be perfectly parallel with another other edge defining the outer boundary 304. Embodiments of the present disclosure also contemplate that an outer boundary 304 of an active area 316 may have one or more edges or segments defined by a spline curve or similar synthetic curve. Such an outer boundary 304 can help to apodize the resonator device, especially when the resonator device is constructed to include an opening and pillar 312.

FIG. 3A illustrates that the inner boundary 308 and pillar 312 may have substantially the same shape. As discussed above, there may be a gap (G) that defines an amount by which an opening is larger than the pillar 312 and this gap (G) may optionally define a size of the inner boundary 308. It should be appreciated, however, that the size and shape of the inner boundary 308 may be controlled by a size and shape of the pillar 312 and/or opening rather than being defined by the size of the gap (G). The size of the gap (G) may vary anywhere between zero and 10 um. The size of the gap (G), in some cases, could become negative (e.g., if the cantilevered portion 252 is long enough to overlap with the pillar 216). In some embodiments, it may be desirable to provide enough margin in the gap (G) to keep the fringing field from penetrating the silicon, but it is a possibility that could occur for thermal considerations. The gap (G) can range from 0 um to 10 um or, more precisely, from 0.2 um to 2 um and can either represent situations when the width of the pillar 216 is larger than the opening 224 or smaller than the opening 224. The size of the gap (G) may be the extension of fringing field in the piezoelectric material, which is considered to be nearly the thickness of the piezoelectric layer 208.

Figure 3B:
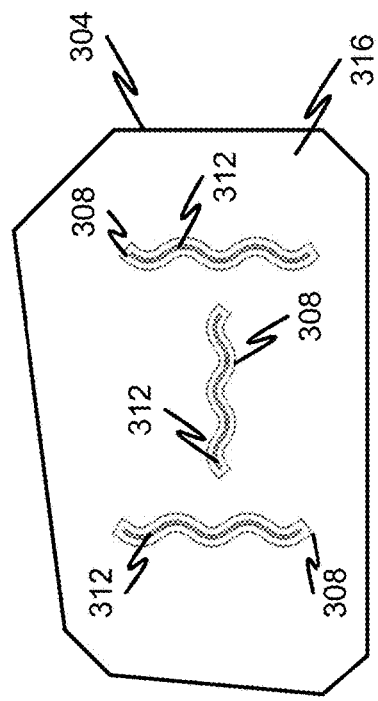
FIG. 3B is a diagram depicting another illustrative configuration of an active area of a BAW resonator in accordance with at least some embodiments of the present disclosure.

It should be appreciated that a resonator device constructed in accordance with embodiments of the present disclosure may include one, two, three, four, or more pillars/opening pairs. For instance, as shown in FIG. 3B, the resonator device is shown to include two pillars 312, each of which contribute to a size and shape of an inner boundary 308. The size and shape of the inner boundary 308 is generally selected to follow the size and shape of the corresponding pillar 312, but does not necessarily have to be designed with this restriction. While the embodiment of FIG. 3B illustrates both pillars 312 as having substantially the same shape, it should be appreciated that such a configuration is not required. For example, a resonator device may be contemplated to include one pillar 312 and inner boundary 308 pair being substantially spline curve-shaped along with another pillar 312 and inner boundary 308 pair that are circular, elliptical, or otherwise not spline curve-shaped.

Figure 3C:
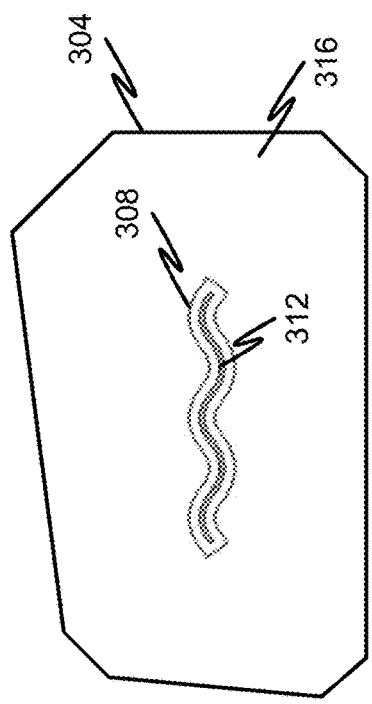
FIG. 3C is a diagram depicting another illustrative configuration of an active area of a BAW resonator in accordance with at least some embodiments of the present disclosure.
Figure 3D:
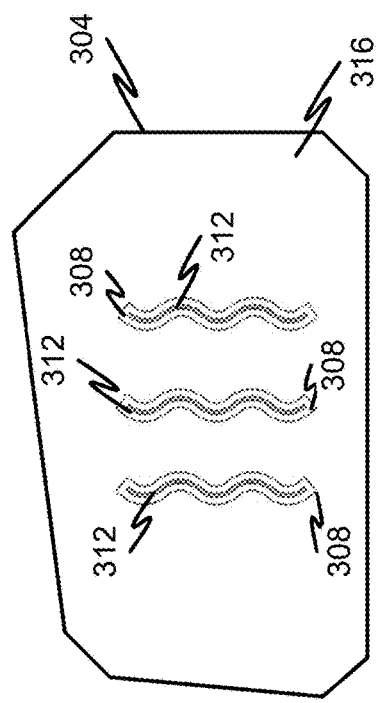
FIG. 3D is a diagram depicting another illustrative configuration of an active area of a BAW resonator in accordance with at least some embodiments of the present disclosure.

FIGS. 3C and 3D illustrate a resonator device having three pillar/opening pairs contributing to three distinct inner boundaries 308. The illustrative configuration of FIG. 3C shows the inner boundary 308 and pillars 312 as being substantially aligned with one another, having substantially the same length as one another, and being defined by substantially the same spline function. FIG. 3D illustrates another possible configuration where at least one of the inner boundary 308 and pillar 312 pairs is oriented differently (e.g., orthogonally) from another of the inner boundary 308 and pillar 312 pairs. This particular example of a resonator device still illustrates each inner boundary 308 as having a similar shape to other inner boundaries 308, but it should be appreciated that such a configuration is not required. Rather, different spline functions may be used to define a shape of different inner boundaries 308. Various combinations of opening 224 and pillar 312 configurations, shapes, and relative placements may be used to achieve improved resonator cooling. In some embodiments, the shape and/or placement of opening 224 and pillars 312 in a resonator device may be selected to optimize current flow and such placements may be selected based on a relative position to other openings 224 and pillars 312 in the resonator device and/or based on a relative position to the outer boundary 304.

Figure 4A:
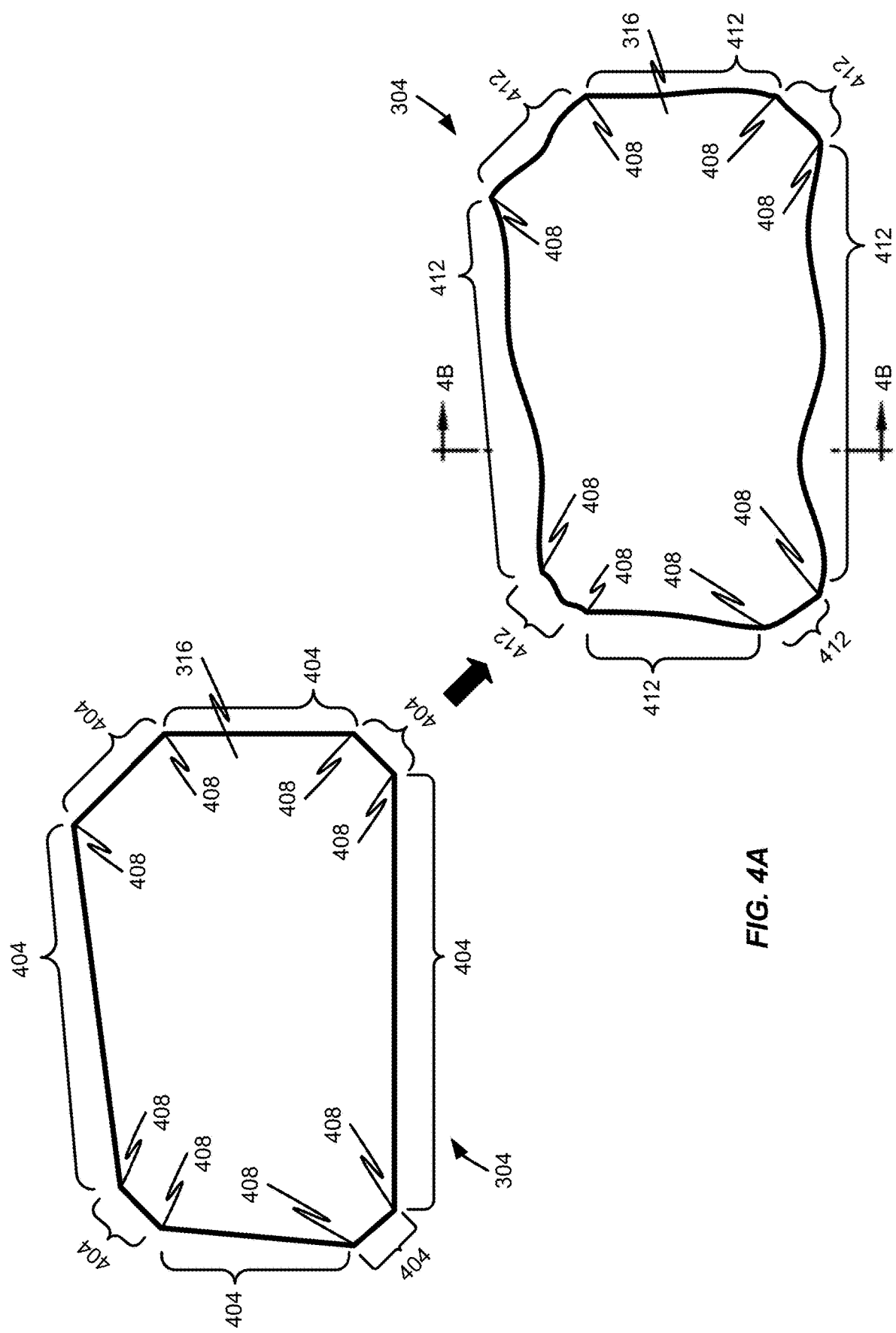
FIG. 4A is a top view of an illustrative BAW resonator and further illustrates a process for transforming a boundary of an active area in accordance with at least some embodiments of the present disclosure.
Figure 4B:
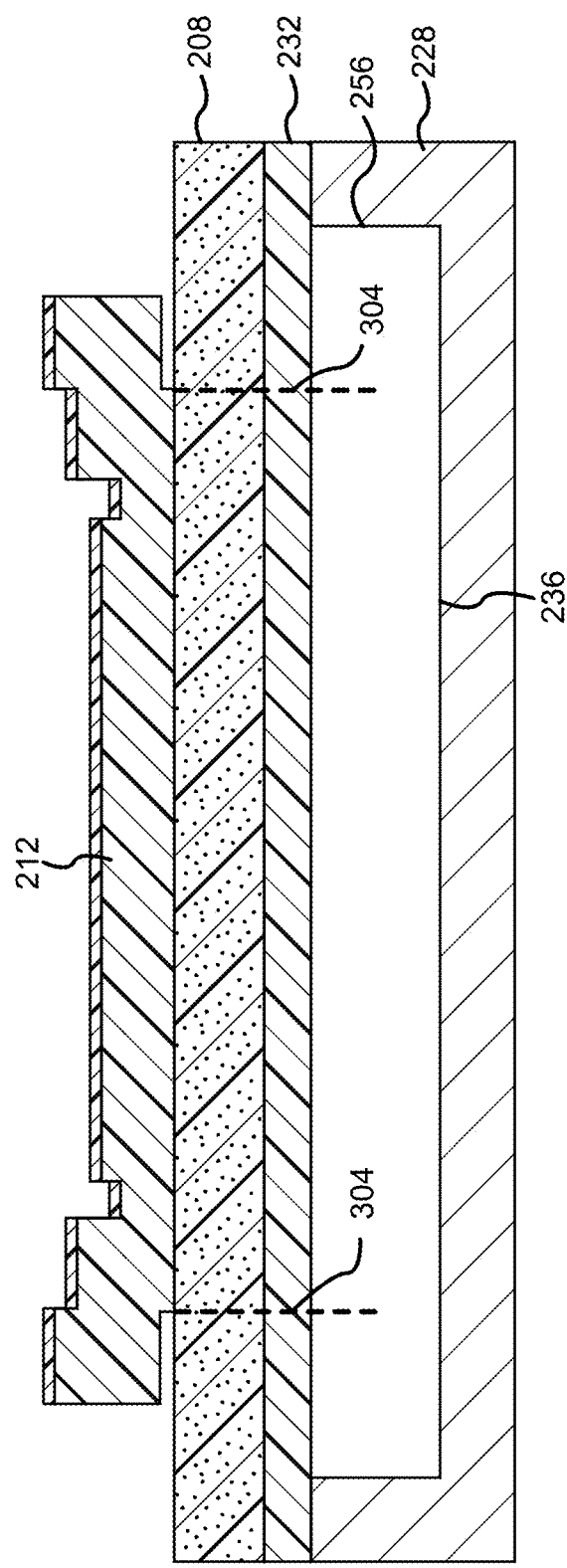
FIG. 4B is a cross-sectional view of the BAW resonator depicted in FIG. 4A taken along line 4B-4B.

With reference now to FIGS. 4A and 4B, additional details of possible configurations for an outer boundary 304 or an active area 316 will be described in accordance with at least some embodiments of the present disclosure. The outer boundary 304 of the active area 316 is first shown as an n-sided polygon, where n equals eight. The initial shape of the outer boundary 304 may be referred to or considered a control polygon, whose size and relative shape/orientation of n-sides is selected to achieve resonance at a particular frequency or band of interest. Each side of the outer boundary 304 in the control polygon is shown to include a straight border segment 404. Each straight border segment 404 interfaces with an adjacent straight border segment 404 at a vertex 408.

In accordance with at least some embodiments of the present disclosure, one or more of the straight border segments 404 forming the outer boundary 304 of the control polygon may be transformed to a curved border segment 412. The transformation of the control polygon to a resulting polygon having one or more curved border segments 412 may achieve a resonator device that more effectively suppresses spurious modes as compared to the control polygon having all straight border segments 404. In some embodiments, during transformation of the control polygon to the resulting polygon, one, some, or all of the straight border segments 404 may be modified to a curved border segment 412 that is substantially spline shaped. In other words, the outer boundary 304, after transformation, may be defined by one or more curved border segments 412. Each curved border segment 412 may interface with an adjacent curved border segment 412 at a vertex 408. The spline shaped-curve of the one or more curved border segments 412 may help further apodize the resonator device, especially when an opening and/or pillar is provided in the resonator device. It should be appreciated, however, that a cavity boundary having one or more curved border segments 412 may be useful for a resonator device not having an opening and/or pillar. The resulting polygon shown in FIGS. 4A and 4B illustrates one example of a resonator device having a cavity boundary defined by one or more curved border segments 412, but not having an opening and/or pillar.

As shown in FIG. 4B, the outer boundary 304 of the active area 316 may not necessarily coincide with the sidewall 256 of the acoustic reflector 236. Rather, the outer boundary 304 may reside within the sidewall 256 and may correspond to a region at which the piezoelectric layer 208 is in contact with (directly or indirectly) the first electrode 212 and the second electrode 232 in the z-direction.

It should be appreciated that, in some embodiments, a straight border segment 404 may only be transformed to a curved border segment 412 in response to the straight border segment 404 of the control polygon being longer than a predetermined length. As a non-limiting example, the predetermined length may correspond to 10 um or less. Any straight border segment 404 being less than or equal to the predetermined length may be left as a straight border segment 404 whereas other straight border segments 404 that are longer than the predetermined length may be transformed or changed to a corresponding curved border segment 412.

Figure 5A:
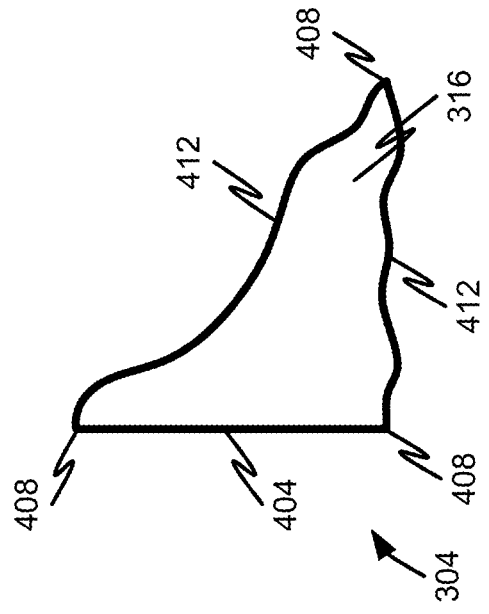
FIG. 5A is a diagram depicting an illustrative boundary of an active area in accordance with at least some embodiments of the present disclosure.

FIGS. 5A thru 6B illustrate other examples of a resonator device having an active area 316 outer boundary 304 defined by one or more curved border segments 412, but not having an opening and/or pillar. More specifically, it should be appreciated that an outer boundary 304 may be n-sided, where n is an integer that is greater than or equal to three. It should also be appreciated that an outer boundary 304 may be configured such that all sides of the polygon defining the outer boundary 304 are curved border segments 412. Alternatively, less than all of the sides of the polygon defining the outer boundary 304 may correspond to curved border segments 412. For example, as shown in FIG. 5A, just a single side of the outer boundary 304 may correspond to a curved border segment 412. In such an example, the curved border segment 412 may interface with two straight border segments 404 at each end of the curved border segment 412.

Figure 5C:
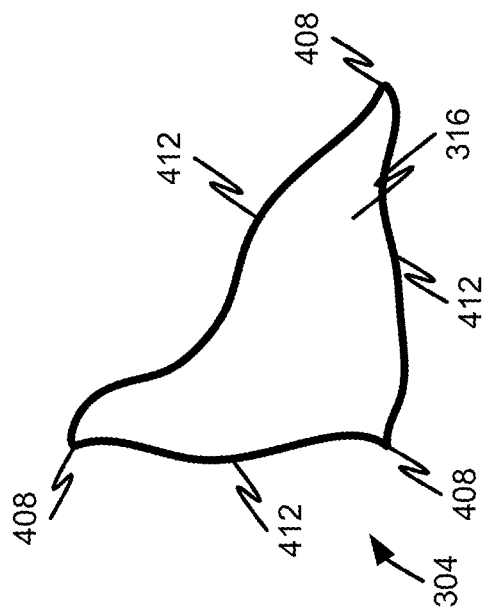
FIG. 5C is a diagram depicting another illustrative boundary of an active area in accordance with at least some embodiments of the present disclosure.
Figure 5B:
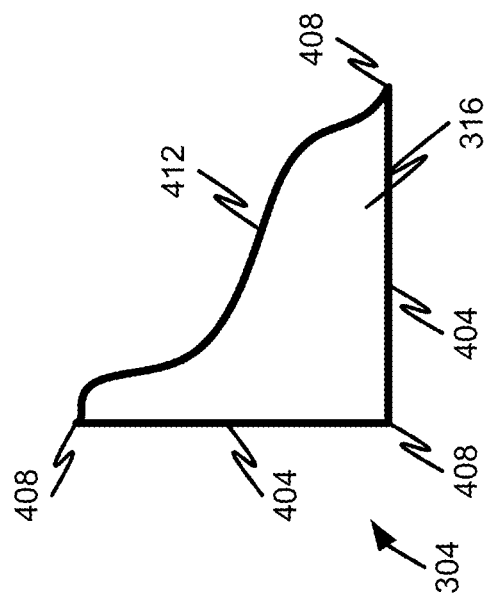
FIG. 5B is a diagram depicting another illustrative boundary of an active area in accordance with at least some embodiments of the present disclosure.

In another example, as shown in FIG. 5B, the outer boundary 304 may have more curved border segments 412 than straight border segments 404, but the number of straight border segments 404 may be equal to or greater than one. In such an embodiment, at least one curved border segment 412 may have one adjacent curved border segment 412 and one adjacent straight border segment 404.

In another example, as shown in FIG. 5C, the outer boundary 304 may have all of its sides correspond to curved border segments 412. In this particular configuration, the polygon defining the outer boundary 304 may be n-sided and have n curved border segments 412.

Figure 6B:
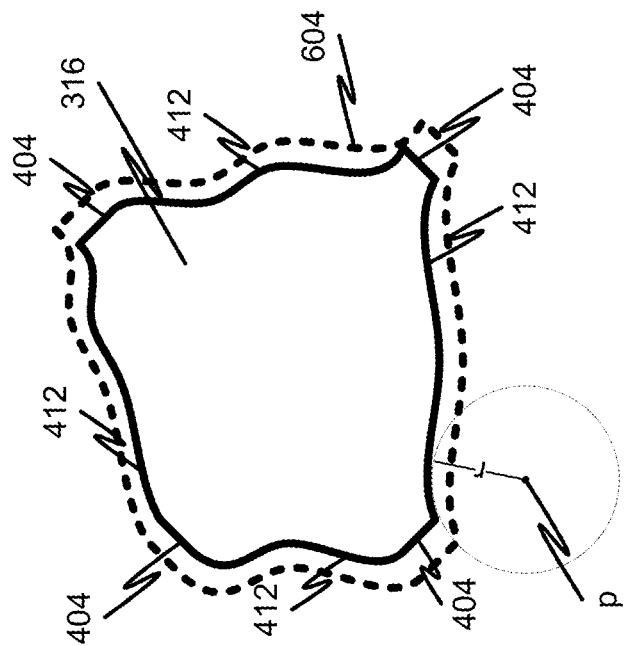
FIG. 6B is a diagram depicting another illustrative boundary of an active area in accordance with at least some embodiments of the present disclosure.
Figure 6A:
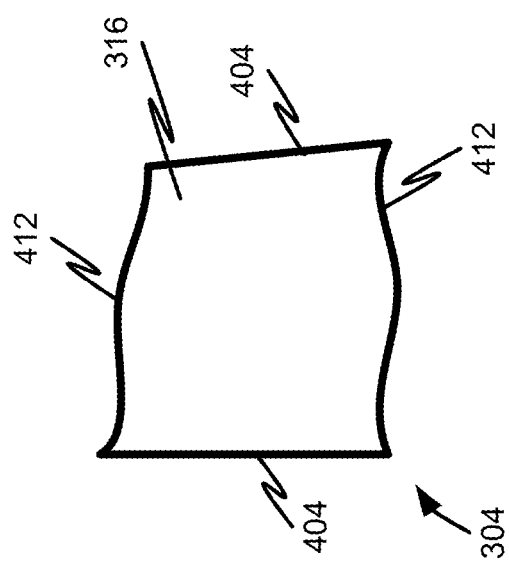
FIG. 6A is a diagram depicting yet another illustrative boundary of an active area in accordance with at least some embodiments of the present disclosure.

FIGS. 6A and 6B illustrate outer boundaries 304 having four or more sides. Specifically, FIG. 6A illustrates the outer boundary 304 as having an equal number of curved border segments 412 and straight border segments 404. Each curved border segment 412 only interfaces with a straight border segment 404 and each straight border segment 404 only interfaces with a curved border segment 412.

FIG. 6B illustrates an eight-sided polygon where the number of curved border segments 412 equals the number of straight border segments 404. In this embodiment and the embodiment of FIG. 6A, each vertex 408 may connect a curved border segment 412 with a straight border segment 404. FIG. 6B also illustrates an additional detail of a curved border segment 412. More specifically, in accordance with at least some embodiments of the present disclosure, a curved border segment 412 may be substantially spline curve-shaped. This may result in the curved border segment 412 having at least one radius of curvature (r) centered at a point (p) that lies outside the active area 116. Said another way, a radius of curvature (r) of a curved border segment 412 may be centered outside of the polygon defined by the outer boundary 304. FIG. 6B further illustrates that the active area 316 may be contained within a larger conformal structure 604. In some embodiments, the conformal structure 604 may correspond to the sidewalls 256 of the acoustic reflector 124, 236. Although depicted as being conformal, the structure 604 may not necessarily have the same shape as the outer boundary 304, but the outer boundary 304 may still reside completely within the structure 604. It may also be possible that the structure 604 can represent an outer area of the first electrode, the second electrode, the piezoelectric layer, or a combination thereof.

Additional details of the curved border segments 412 and curves which may be used to define such curved border segments 412 will be described in further detail with reference to FIGS. 8A thru 8C. In accordance with at least some embodiments, a control polygon can be used and modified to realize a polygon with one or more curved border segments 412. Advantageously, the use of a spline function to modify a straight border segment 404 to a curved border segment 412 does not significantly increase or decrease the perimeter of the outer boundary 304. This effectively preserves the resistance at parallel resonance (Rp). Thus, the resonator device can be designed using traditional polygons having straight border segments 404, but then an improved resonator device can be realized having one or more curved border segments 412 whose length is near, but not identical, to the straight border segment 404 of the control polygon used during design of the resonator device.

Figure 7A:
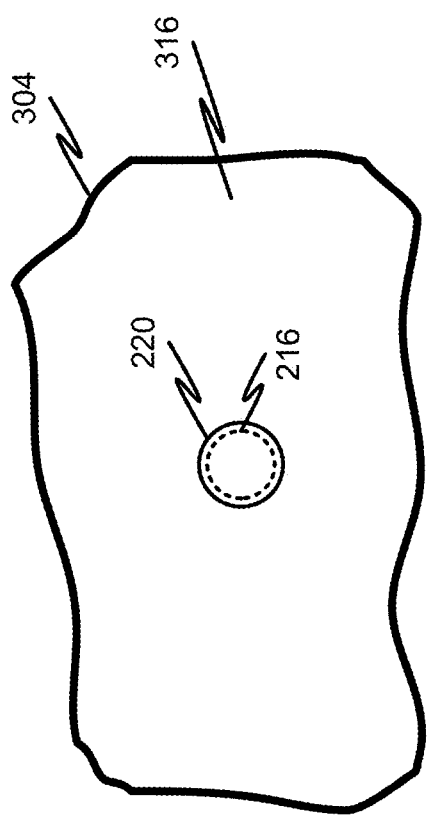
FIG. 7A is a diagram depicting another illustrative configuration of an active area in accordance with at least some embodiments of the present disclosure.
Figure 7B:
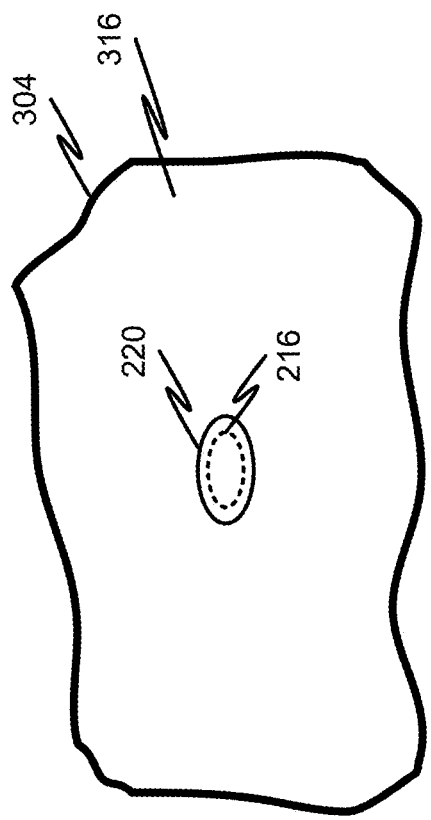
FIG. 7B is a diagram depicting another illustrative configuration of an active area in accordance with at least some embodiments of the present disclosure.
Figure 7C:
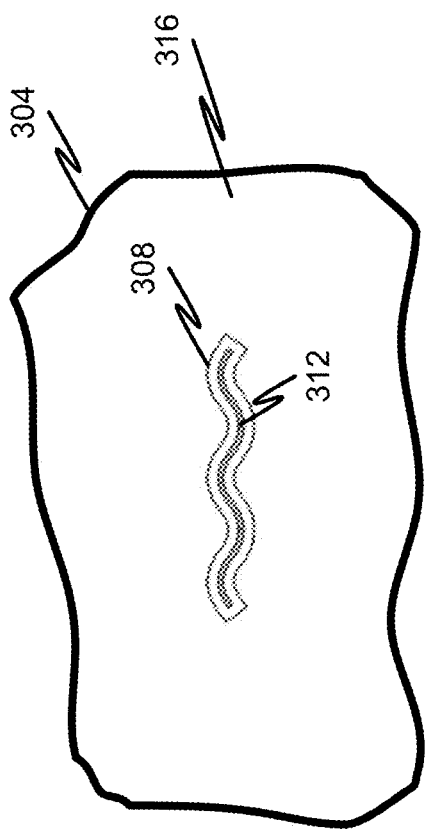
FIG. 7C is a diagram depicting another illustrative configuration of an active area in accordance with at least some embodiments of the present disclosure.
Figure 7D:
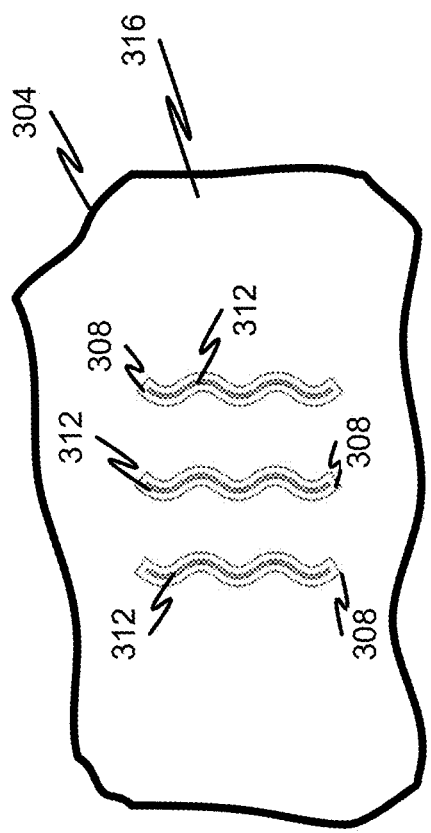
FIG. 7D is a diagram depicting another illustrative configuration of an active area in accordance with at least some embodiments of the present disclosure.
Figure 7F:
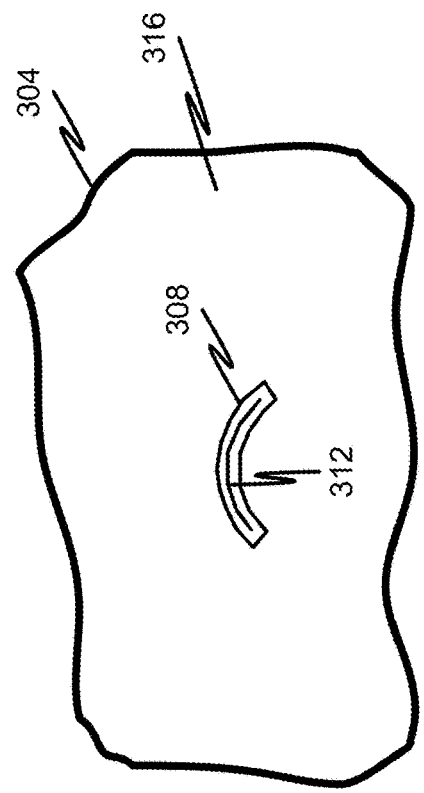
FIG. 7F is a diagram depicting another illustrative configuration of an active area in accordance with at least some embodiments of the present disclosure.
Figure 7E:
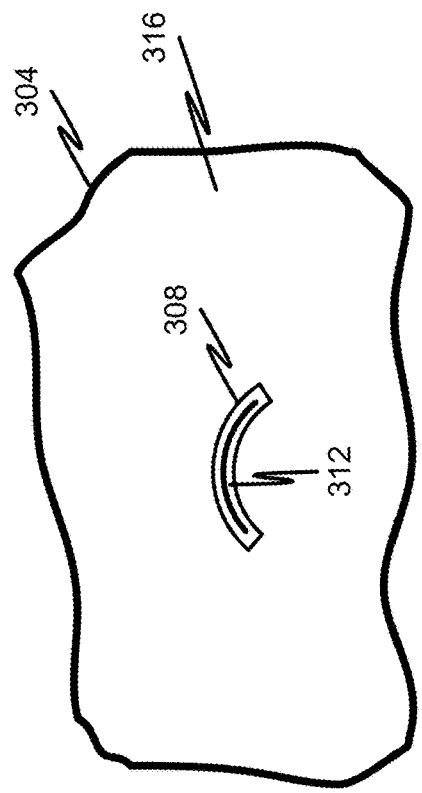
FIG. 7E is a diagram depicting another illustrative configuration of an active area in accordance with at least some embodiments of the present disclosure.

Referring now to FIGS. 7A thru 7F, additional illustrative configurations of resonator devices will be described in accordance with at least some embodiments of the present disclosure. As discussed above, a BAW resonator 104 or resonator device 200 may be provided with an active area 316 having an outer boundary 304. The outer boundary 304 may or may not include one or more curved border segments 412. Alternatively or additionally, the acoustic reflector 124, 236 may or may not include one or more pillars 128, 216. Alternatively or additionally, the BAW resonator 104 or resonator device 200 may be provided with one or more openings 132, 224, which may have a corresponding pillar 128, 216. FIGS. 7A thru 7D show configurations of a resonator device 104, 200 having a combination of an outer boundary 304 defined by one or more spline curves and one or more inner boundaries 308 also defined by one or more spline curves. FIG. 7E illustrates a configuration of a resonator device 104, 200 having an outer boundary 304 defined by one or more spline curves, but the inner boundary 308 defined by a single arc or single curve. FIG. 7F illustrates a configuration of a resonator device 104, 200 having an outer boundary 304 defined by one or more spline curves, but the inner boundary 308 exhibits a curve that is approximated by a plurality of straight-line segments. While not depicted, it should be appreciated that one or more segments of the outer boundary 304 may have one or more curves that are approximated or realized with a plurality of straight line segments rather than being constructed with true arcs or spline curves.

FIG. 7A illustrates a configuration where the outer boundary 304 of the active area 316 has all sides thereof being substantially spline curve-shaped. The resonator device of FIG. 7A also exhibits a spline curve-shaped pillar 312 and the active area 316 includes a spline curve-shaped inner boundary 308.

FIG. 7B illustrates a configuration where the outer boundary 304 has all sides thereof being substantially spline curve-shaped; however, the resonator device is shown to include a circular-shaped pillar 216 and opening 220. This will effectively create a circular-shaped inner boundary (not depicted). Although not depicted, another embodiment of a resonator device is contemplated where two pillar/opening pairs are provided within the outer boundary 304, but the two pillar/opening pairs do not share the same shape. Specifically, a resonator device may be provided with one pillar/opening pair being substantially spline curve-shaped and another pillar/opening pair being substantially circular-shaped (e.g., a combination of the configurations depicted in FIGS. 7A and 7B).

FIG. 7C illustrates another possible configuration of a resonator device where the outer boundary 304 has all sides thereof being substantially spline curve-shaped. The resonator device of FIG. 7C also exhibits three pillar/opening pairs, each of which are substantially spline curve-shaped.

FIG. 7D illustrates a variation of the configuration shown in FIG. 7B. Specifically, the resonator device of FIG. 7D is shown to include an outer boundary 304 having all sides thereof being substantially spline curve-shaped. The pillar 216 and opening 220, however, are shown to be substantially elliptical when viewed from the top.

Figure 8B:
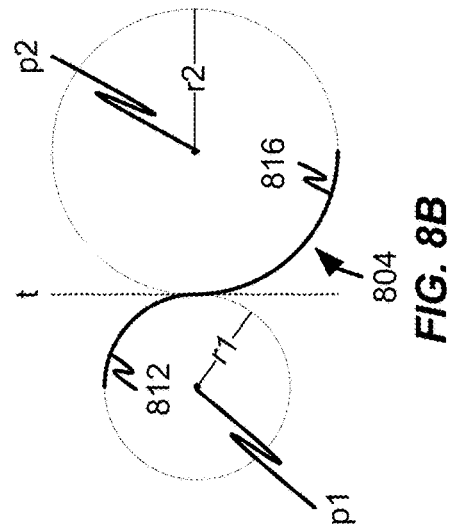
FIG. 8B is a second diagram depicting a spline-shaped curve in accordance with at least some embodiments of the present disclosure.
Figure 8C:
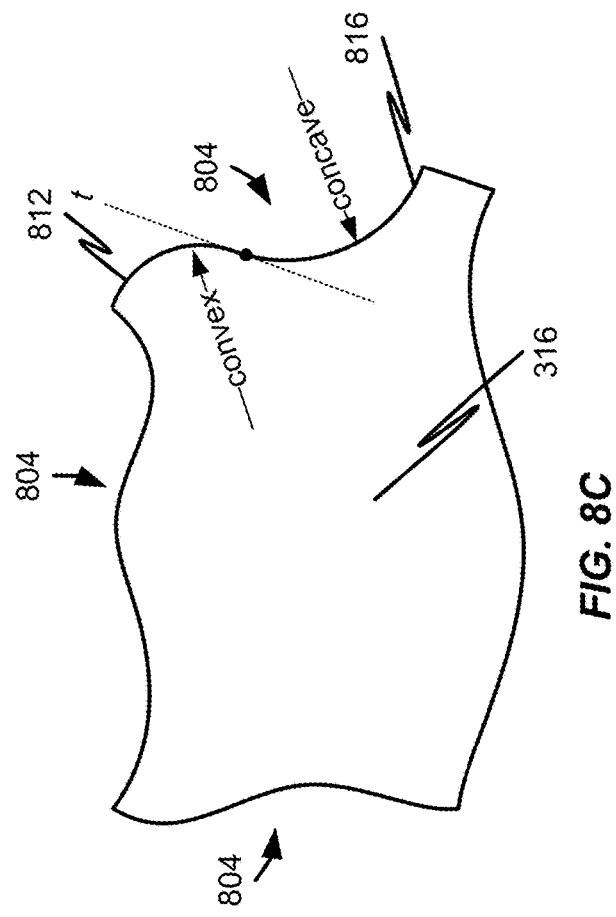
FIG. 8C is a third diagram depicting a spline-shaped curve with respect to an active area in accordance with at least some embodiments of the present disclosure.
Figure 8A:
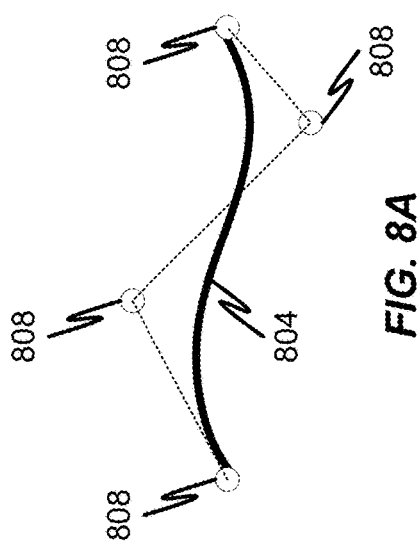
FIG. 8A is a first diagram depicting a spline-shaped curve in accordance with at least some embodiments of the present disclosure.

With reference now to FIGS. 8A thru 8C, various details of a spline curve 804 and its relationship with or contribution to an outer boundary 304 and/or inner boundary 308 of an active area 316 will be described in accordance with at least some embodiments of the present disclosure. It should be appreciated that the details described in connection with the spline curve 804 may be applied to the various spline curve-shaped elements depicted and described herein. Specifically, definitions or features of a spline curve 804 may be applied to describe a spline curve-shaped inner boundary 308, a spline curve-shaped pillar 312, a spline curve-shaped curved border segment 412, a spline curve-shaped outer boundary 304 or any other portion of a resonator device depicted and described herein as having (or being capable of having) a shape that is similar to or defined by a spline curve 804. Furthermore, as depicted in FIG. 7F, it should be appreciated that a spline curve 804 does not necessarily have to be realized with perfect arcs. Rather, a spline curve 804 may be approximated with a plurality of straight-line segments. Alternatively or additionally, a spline curve 804 may be realized with individual arc segments where each arc segment only has a single radius of curvature, but each individual arc segment is connect with another segment (whether straight, arc, or spline curve-shape) to functionally realize a spline curve 804.

With reference to FIG. 8A, a first illustrative spline curve 804 is shown to include at least three control points 808. More specifically, the spline curve 804 is shown to include four control points 808, each of which are used to define the shape of the spline curve 804. In some embodiments, a spline curve 804 may have its sign change at least once and the shape of the spline curve 804 as its changes sign may be defined by at least three control points 808. As a specific, but non-limiting example, the spline curve 804 may correspond to a Bezier curve of order n, which is a special sub-type of a parametric equation.

Bezier curves are formed from n control points $(x_i, y_i)$ and n Bernstein polynomials. The x and y parameters of Bezier curve are represented by $$x(t) = \sum_{i=0}^{n} x_i B_{i \bullet n}(t)$$

$$y(t) = \sum_{i=0}^{n} y_i B_{i \bullet n}(t)$$

The formula for a Bernstein polynomial is $$B_{i,n}(t) = \binom{n}{i} t^i (1-t)^{n-i}.$$

In particular, a Bezier curve has the following useful properties: (1) a curve is always inside the polygon formed by the control points 808 and (2) the edges of the Bezier curve are always tangent to the nearest control points 808.

A Bezier curve can be used to approximate a circle, but cannot form a true circle. This is useful because shapes with large degrees of regularity can allow unwanted frequencies to resonate in a resonator device.

For an electrical filter 100, one goal may be to have one frequency resonate, and all other frequencies suppressed. In particular for FBAR, the main resonance frequency is set by the vertical stackup, but there can be additional frequencies which resonate laterally.

By choosing polygons with every larger numbers of sides and non-repeating angles, the chance of an accidental resonance can be made vanishingly small, though the code to generate such structures becomes ever more complicated and fitting such structures together into a compact filter may be relatively problematic.

As discussed above, current resonator devices may be designed as a polygon with no parallel edges, to extinguish most undesired lateral resonance frequencies. However, as more current goes through the resonator device, the center of the resonator device becomes a hot spot (shaped in the direction of the current flow), affecting not only the performance of the resonator device but also its lifespan. To drain the heat from the center of the acoustic reflector 124, 236, a pillar 128, 216 can be inserted. If the pillar 128, 216 is not substantially spline curve-shaped, but rather is circular or elliptically-shaped, the size of the circular or elliptical shape can be quite large, which can increase the overall size of the resonator device as well as force the heat in unexpected directions as the current flows "around" the heat sink. Therefore, the addition of a regular structure (e.g., circle or ellipse, both drawn as n-sided polygons) can insert in those parallel resonances that the designers have worked so hard to extinguish.

In the case of a Bezier curve, the heat sink provided by the pillar 128, 216 can be designed specifically to address the expected hot spots, minimizing any increase in resonator device size. The curve 804 can also be exactly adjusted around the expected current flow, making sure that no new hot spots develop and minimizing the overall increase in size of the resonator device. While portions of the curve 804 may be parallel to each other and to the external edge, the smoothly varying curve 804 or the small piece-wise continuous shape may ensure that the actual length of the parallel sides are made negligibly small.

Another option, using a series of straight-line polygons, would also achieve the exact same performance of the Bezier curve with a slight decrease in size. However, it would possibly result in much longer parallel sides between the polygon pillar 128, 216 and the external cavity boundary 304 of the resonator device, causing unintended resonance frequencies.

Any order Bezier curve can be used for the curve 804. In some embodiments, a Bezier curve of order 3 can be used, rotated and shifted multiple times if necessary (which in itself is another Bezier curve).

In some embodiments, to both allow for more tightly packing resonator devices next to each other in the electrical filter 100, while also encouraging ease of design is the use of 4th degree Bezier functions along the outer boundary 304 and/or inner boundary 308 of the active area 316. With properly chosen control points 808, not only does this add (in a controlled fashion) further segments to the polygon, reducing the chance of undesired resonances, but it also allows the resonator devices be packed more tightly, reducing the overall size of the die. Fourth degree Bezier functions are interesting to use because they can be designed to resemble or approximate an original straight border segment 404. This means that any initial design or a control polygon can then be "retrofit" with one or multiple curved border segments 412, which would theoretically increase both design speed and design performance. In some embodiments, the use of a Bezier curve allows for the electrical filter 100 to more closely pack resonator devices together and shrink the overall size of the filter die.

FIG. 8B illustrates another possible set of features for a spline curve 804. In particular, the spline curve 804 used in accordance with embodiments of the present disclosure may include a first portion 812 and a second portion 816, which meet at a common tangent (t). The first portion 812 may have at least one curve with a first radius (r1) that is centered at a first point (p1). The second portion 812 may also have at least one curve with a second radius (r2) that is centered at a second point (p2). The spline curve 804 may change sign at least once, which means that the first point (p1) may be provided on one side of the spline curve 804 and the second point (p2) may be provided on the opposite side of the spline curve 804.

FIG. 8B illustrates that the first radius (r1) does not necessarily need to be the same as the second radius (r2). It should be appreciated that the first radius (r1) and the second radius (r2) may be the same or different, but are centered at different points (p1), (p2), respectively.

Alternatively, the first portion 808 may correspond to an individual arc-shaped line segment and the second portion 812 may correspond to a different arc-shaped line segment. Individual arc-shaped line segments may be placed together, end-to-end, as shown in FIG. 8B to functionally realize a spline curve 804.

Another way of representing the spline curve 804 is shown in FIG. 8C. As mentioned above, the spline curve 804 may change sign at least one. This may cause the spline curve 804 to change its concavity at least once (e.g., as its sign changes). In some embodiments, the first portion 812 may be regarded as being convex with respect to the active area 316 before meeting the common tangent (t) and the second portion 816 may be regarded as being concave with respect to the active area 316 beyond the common tangent (t). Thus, in some embodiments, the spline curve 804 may have both a convex portion (e.g., the first portion 812) and a concave portion (e.g., the second portion 816). In some embodiments, the spline curve 804 may face outward from the active area 316 (e.g., be concave relative to the active area 316) at least once, but possibly more than once.

While certain examples of active area 316 borders 304, 308 have been described as being substantially spline curve-shaped, it should be appreciated that embodiments of the present disclosure are not so limited. For instance, a boundary 304, 308 and/or curved border segment 412 does not necessarily have to exhibit a property of concavity for each segment. Rather, the concavity may be exhibited in the overall boundary (e.g., the outer boundary 304) without being exhibited in a particular curved border segment 412. In other words, the property of concavity doesn't necessarily have to apply to each curved border segment 412 that belongs to a boundary 304, 308. One or more curved border segments 412 may be convex (instead of concave). The same thing can be said for any pillar 128, 216 or opening 132, 224. As an example, a given side of a control polygon could be converted to a single arc (e.g., the curved border segment 412 may only have a single arc), but the overall shape of a larger segment of the cavity boundary 304 may have both convex and concave segments.

As discussed herein, a number of different configurations of a resonator device and/or BAW resonator device are contemplated. It is one aspect of the present disclosure to provide a BAW resonator, including: a first electrode; a second electrode; a piezoelectric layer disposed between the first electrode and the second electrode; a substrate positioned adjacent to the second electrode such that the second electrode is disposed between the substrate and the piezoelectric layer; and an active area having at least one boundary with a first curvature and a second curvature that share a common tangent at a connecting point between the first curvature and the second curvature, where a radius of the first curvature is centered at a different point than a radius of the second curvature.

Another aspect of the present disclosure provides that the first curvature and the second curvature of the at least one boundary form a spline-shaped curve including at least three control points.

Another aspect of the present disclosure provides that the spline-shaped curve includes an approximation of a Bezier curve.

Another aspect of the present disclosure provides that the first electrode includes an opening formed therein that is positioned in an overlapping relationship relative to the active area and where the at least one boundary includes an inner boundary of the active area.

Another aspect of the present disclosure provides that the opening is substantially spline curve-shaped.

Another aspect of the present disclosure provides that the BAW resonator further includes a pillar positioned within an acoustic reflector. In some embodiments, the pillar is substantially spline curve-shaped to match the substantially spline curve-shaped opening. In some embodiments, the at least one boundary further includes an outer boundary. In some embodiments, the first electrode further includes a second opening and the BAW resonator further includes: a second pillar positioned within the acoustic reflector, where the second pillar is overlapped by the second opening and where the second pillar and the second opening are both substantially spline curve-shaped. In some embodiments, the pillar is formed of a material having a substantially similar coefficient of thermal expansion as the substrate.

Another aspect of the present disclosure provides a resonator device, including: a first electrode having a first surface and an opposing second surface; a piezoelectric layer having a first surface and an opposing second surface, where the first surface of the piezoelectric layer faces toward the second surface of the first electrode; a second electrode having a first surface and an opposing second surface, where the first surface of the second electrode faces toward the second surface of the piezoelectric layer; a substrate positioned adjacent to the second surface of the second electrode; an acoustic reflector adjacent to the second surface of the second electrode; and an active area that is at least partially defined by a curved boundary including a concavity that changes sign at least once.

Another aspect of the present disclosure provides that the curved boundary is part of a spline curve and the curved boundary includes an outer boundary of the active area.

Another aspect of the present disclosure provides that the spline curve includes an approximation of a Bezier curve.

Another aspect of the present disclosure provides that the active area is defined by a plurality of curved outer boundaries that include the curved boundary and at least one additional curved outer boundary and where the curved boundary and the at least one additional curved outer boundary connect with one another at a common vertex, where the at least one additional curved outer boundary includes a first portion and a second portion, where the first portion of the at least one additional curved outer boundary is concave with respect to the active area, and where the second portion of the at least one additional curved boundary is convex with respect to the active area.

Another aspect of the present disclosure provides that resonator device further includes a pillar positioned within the acoustic reflector, where the pillar is substantially spline curve-shaped. In some embodiments, the substantially spline curve-shaped pillar includes a series of curves defined by at least three control points and contributes to an inner curved boundary of the active area. In some embodiments, the first electrode includes a spline curve-shaped opening therein and the spline curve-shaped opening substantially overlaps the substantially spline curve-shaped pillar.

Another aspect of the present disclosure provides that the curved boundary includes a plurality of spline curve-shaped segments, where each segment in the plurality of spline curve-shaped segments include an orientation based, at least in part, on segments of a control polygon and where each segment in the plurality of spline curve-shaped segments is curved only in response to a corresponding segment of the control polygon being longer than a predetermined length.

Another aspect of the present disclosure provides an electrical filter, including: a bulk acoustic wave resonator, comprising: a first electrode; a second electrode; a piezoelectric layer disposed between the first electrode and the second electrode; a substrate positioned adjacent to the second electrode; and an active area having at least one biarc boundary.

Another aspect of the present disclosure provides that the at least one biarc boundary includes a first curvature and a second curvature that share a common tangent at a connecting point between the first curvature and the second curvature, where the first electrode includes a substantially spline curve-shaped opening therein, and where the bulk acoustic wave resonator further includes: a substantially spline curve-shaped pillar positioned within the active area, where the substantially spline curve-shaped pillar is shaped to match the substantially spline curve-shaped opening.

The various components, materials, structures and parameters are included by way of illustration and example only and not in any limiting sense. In view of this disclosure, those skilled in the art can implement the present teachings in determining their own applications and needed components, materials, structures and equipment to implement these applications, while remaining within the scope of the appended claims.

What is claimed is:

1. A bulk acoustic wave resonator, comprising:
   a first electrode having an opening;
   a second electrode;
   a piezoelectric layer disposed between the first electrode and the second electrode;
   a substrate positioned adjacent to the second electrode such that the second electrode is disposed between the substrate and the piezoelectric layer; and
   an active area having at least one boundary with a first curvature and a second curvature that share a common tangent at a connecting point between the first curvature and the second curvature, wherein a radius of the first curvature is centered at a different point than a radius of the second curvature; and
   an acoustic reflector having a pillar disposed within the acoustic reflector, wherein the first electrode has an opening, wherein the pillar has a first curve-shape substantially matching a second curve-shape of the opening, the first curve shape having concave and convex portions.

2. The bulk acoustic wave resonator of claim 1, wherein the first curvature and the second curvature of the at least one boundary form a spline-shaped curve comprising at least three control points.

3. The bulk acoustic wave resonator of claim 2, wherein the spline-shaped curve comprises an approximation of a Bezier curve.

4. The bulk acoustic wave resonator of claim 1, wherein the opening is positioned in an overlapping relationship relative to the active area and wherein the at least one boundary comprises an inner boundary of the active area.

5. The bulk acoustic wave resonator of claim 4, wherein the opening is substantially spline curve-shaped.

6. The bulk acoustic wave resonator of claim 5, where the pillar has convex and concave surfaces.

7. The bulk acoustic wave resonator of claim 6, wherein the pillar is substantially spline curve-shaped to match the substantially spline curve-shaped opening.

8. The bulk acoustic wave resonator of claim 7, wherein the at least one boundary further comprises an outer boundary.

9. The bulk acoustic wave resonator of claim 7, wherein the first electrode further comprises a second opening and wherein the bulk acoustic wave resonator further comprises:
   a second pillar positioned within the acoustic reflector, wherein the second pillar is overlapped by the second opening and wherein the second pillar and the second opening are both substantially spline curve-shaped.

10. The bulk acoustic wave resonator of claim 6, wherein the pillar is formed of a material having a substantially similar coefficient of thermal expansion as the substrate.

11. A resonator device, comprising:
    a first electrode having a first surface and an opposing second surface;
    a piezoelectric layer having a first surface and an opposing second surface, wherein the first surface of the piezoelectric layer faces toward the second surface of the first electrode;
    a second electrode having a first surface and an opposing second surface, wherein the first surface of the second electrode faces toward the second surface of the piezoelectric layer;

a substrate positioned adjacent to the second surface of the second electrode;
an acoustic reflector adjacent to the second surface of the second electrode; and
an active area that is at least partially defined by a curved boundary comprising a concavity that changes sign at least once; and
wherein the acoustic reflector has a pillar disposed with the acoustic reflector, wherein the first electrode has an opening, wherein the pillar has a first curve-shape substantially matching a second curve-shape of the opening, the first curve shape having concave and convex portions.

12. The resonator device of claim 11, wherein the curved boundary is part of a spline curve and wherein the curved boundary comprises an outer boundary of the active area.

13. The resonator device of claim 12, wherein the spline curve comprises an approximation of a Bezier curve.

14. The resonator device of claim 11, wherein the active area is defined by a plurality of curved outer boundaries that include the curved boundary and at least one additional curved outer boundary and wherein the curved boundary and the at least one additional curved outer boundary connect with one another at a common vertex, wherein the at least one additional curved outer boundary comprises a first portion and a second portion, wherein the first portion of the at least one additional curved outer boundary is concave with respect to the active area, and wherein the second portion of the at least one additional curved outer boundary is convex with respect to the active area.

15. The resonator device of claim 11, further comprising:
a pillar positioned within the acoustic reflector, wherein the pillar is substantially spline curve-shaped.

16. The resonator device of claim 15, wherein the substantially spline curve-shaped pillar comprises a series of curves defined by at least three control points and contributes to an inner curved boundary of the active area.

17. The resonator device of claim 15, wherein the first electrode comprises a spline curve-shaped opening therein and wherein the spline curve-shaped opening substantially overlaps the substantially spline curve-shaped pillar.

18. The resonator device of claim 11, wherein the first and second curved shapes comprise a bi-arc.

19. A resonator device, comprising:
a first electrode having a first surface and an opposing second surface;
a piezoelectric layer having a first surface and an opposing second surface, wherein the first surface of the piezoelectric layer faces toward the second surface of the first electrode;
a second electrode having a first surface and an opposing second surface, wherein the first surface of the second electrode faces toward the second surface of the piezoelectric layer;
a substrate positioned adjacent to the second surface of the second electrode;
an acoustic reflector adjacent to the second surface of the second electrode; and
an active area that is at least partially defined by a curved boundary comprising a concavity that changes sign at least once, wherein the curved boundary comprises a plurality of spline curve-shaped segments, wherein each segment in the plurality of spline curve-shaped segments comprise an orientation based, at least in part, on segments of a control polygon and wherein each segment in the plurality of spline curve-shaped segments is curved only in response to a corresponding segment of the control polygon being longer than a predetermined length.

20. The resonator device of claim 19, wherein at least one of the curved-shaped segments comprises a bi-arc.

21. An electrical filter, comprising:
a bulk acoustic wave resonator, comprising:
a first electrode;
a second electrode;
a piezoelectric layer disposed between the first electrode and the second electrode; and
a substrate positioned adjacent to the second electrode; and
an active area having at least one biarc boundary; and
an acoustic reflector having a pillar disposed with the acoustic reflector, wherein the first electrode has an opening formed, wherein the pillar has a first curve-shape substantially matching a second curve-shape of the opening, the first curve shape having concave and convex portions.

22. The electrical filter of claim 21, wherein the at least one biarc boundary comprises a first curvature and a second curvature that share a common tangent at a connecting point between the first curvature and the second curvature, wherein the first electrode comprises a substantially spline curve-shaped opening therein, and wherein the bulk acoustic wave resonator further comprises:
a substantially spline curve-shaped pillar positioned within the active area, wherein the substantially spline curve-shaped pillar is shaped to match the substantially spline curve-shaped opening.

* * * * *